United States Patent [19]

Baglee et al.

[11] Patent Number: 4,569,117
[45] Date of Patent: Feb. 11, 1986

[54] METHOD OF MAKING INTEGRATED CIRCUIT WITH REDUCED NARROW-WIDTH EFFECT

[75] Inventors: David A. Baglee; Michael C. Smayling; Michael P. Duane, all of Houston, Tex.; Mamoru Itoh, Ibaragi, Japan

[73] Assignee: Texas Instruments Incorporated, Dallas, Tex.

[21] Appl. No.: 608,606

[22] Filed: May 9, 1984

[51] Int. Cl.⁴ ............................................. H01L 21/82
[52] U.S. Cl. ..................... 29/571; 29/576 B; 29/576 W; 148/1.5; 148/187
[58] Field of Search ................ 29/571, 576 B, 576 W; 148/1.5, 187

[56] References Cited

U.S. PATENT DOCUMENTS

| | | | |
|---|---|---|---|
| 4,055,444 | 10/1977 | Rao | 148/1.5 |
| 4,179,792 | 12/1979 | Marshall et al. | 148/1.5 X |
| 4,239,993 | 12/1980 | McAlexander et al. | 307/279 X |
| 4,271,583 | 6/1981 | Kahng et al. | 29/576 W X |
| 4,361,600 | 11/1982 | Brown | 23/576 W X |
| 4,370,798 | 2/1983 | Lien et al. | 148/1.5 X |
| 4,388,121 | 6/1983 | Rao | 148/1.5 |
| 4,390,393 | 6/1983 | Ghezzo et al. | 29/576 W X |
| 4,443,933 | 4/1984 | DeBrebisson | 29/576 W X |
| 4,472,874 | 9/1984 | Kurosawa et al. | 148/1.5 X |

*Primary Examiner*—George T. Ozaki
*Attorney, Agent, or Firm*—John G. Graham

[57] ABSTRACT

A method of making MOS integrated circuits employs high-pressure oxidation of the surface of a silicon slice to create thermal field oxide for device isolation. The implant used prior to this oxidation to provide the channel-stop regions beneath the field oxide may be at a lower dosage, and yet the field-transistor threshold voltage is maintained at a high level. Thus, encroachment of the channel stop impurity into the transistor channel is minimized, and higher density devices are permitted.

8 Claims, 5 Drawing Figures

METHOD OF MAKING INTEGRATED CIRCUIT WITH REDUCED NARROW-WIDTH EFFECT

BACKGROUND OF THE INVENTION

This invention relates to semiconductor devices, and more particularly to methods of making MOS integrated circuits.

In the local-oxidation or "LOCOS" process for making self-aligned, silicon-gate MOS integrated circuits, field oxide is grown at high temperature using nitride as an oxidation mask. A channel stop region is created beneath the field oxide by a P+ implant prior to oxidation. The P-type impurity from the channel stop implant encroaches upon the transistor channel areas during the high temperature oxidation. This creates a problem in geometric integrity, and can also raise the apparent threshold of the transistors, referred to as "narrow width effects," especially in high density devices where the channel widths are very small, perhaps one or two microns, as is the case for 1-megabit dynamic RAMs, for example.

It is the principal object of the invention to provide an improved process for making semiconductor integrated circuits, particularly high density MOS devices. Another object is to reduce the narrow width effect of encroachment of channel stop impurity in the manufacture of MOS integrated circuits. A further object is to provide improved isolation when using the local-oxidation process for making high density MOS devices.

SUMMARY OF THE INVENTION

In accordance with one embodiment of the invention, a method of making MOS integrated circuits employs high-pressure oxidation of the surface of a silicon slice to create thermal field oxide for device isolation. The implant used prior to this oxidation to provide the channel-stop regions beneath the field oxide may be at a lower dosage, and yet the field-transistor threshold voltage is maintained at a high level. Thus, encroachment of the channel stop impurity into the transistor channel is minimized, and higher density devices are permitted.

BRIEF DESCRIPTION OF THE INVENTION

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 3:
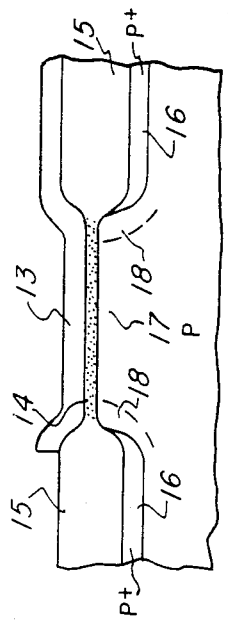
FIG. 3 is an elevation view in section of the device of FIG. 1, taken along the line 3—3 of FIG. 1.
Figure 1:
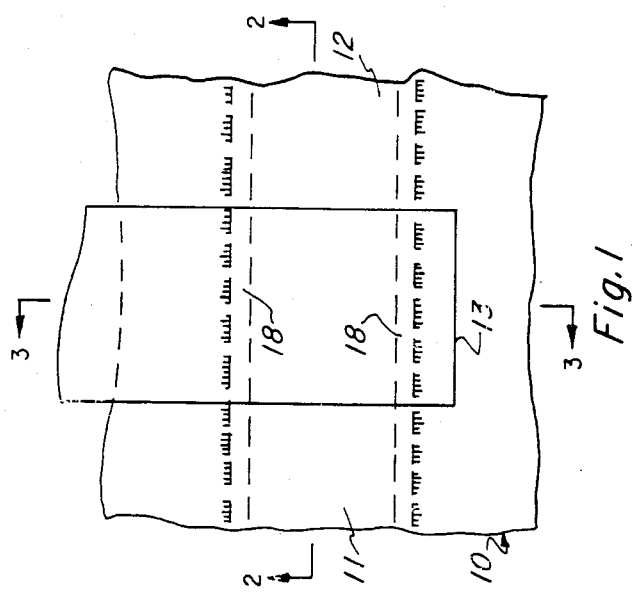
FIG. 1 is a plan view, greatly enlarged, of an MOS transitor which may be made by the method of the invention.
Figure 2:
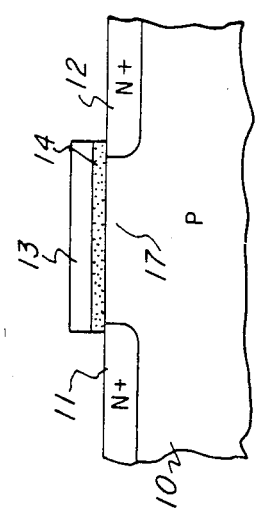
FIG. 2 is an elevation view in section of the device of FIG. 1, taken along the line 2—2 of FIG. 1.

Referring to FIGS. 1, 2 and 3, there is shown a typical N-channel silicon-gate MOS transistor of the type made by the self-aligned process disclosed in U.S. Pat. No. 4,055,444 or 4,388,121 issued to G. R. Mohan Rao, assigned to Texas Instruments. This transistor is formed in a P-type silicon bar 10 and has N+ source/drain regions 11 and 12 and a polysilicon gate 13 over thin gate oxide 14, and employs thick field oxide 15 grown into the silicon surface for isolating one transistor or N+ region from another. Many thousands of these transistors are formed in a bar 10 to provide, for example, a dynamic RAM of the type shown in U.S. Pat. No. 4,239,993 issued to McAlexander, White and Rao, assigned to Texas Instruments.

A P+ channel stop region 16 is created beneath the thermally-grown field oxide 15 as set forth in U.S. Pat. Nos. 4,055,444 or 4,388,121. Due to the high temperature and lengthy time used to grow the field oxide 15, the P-type boron impurity used to create the channel stop 16 will diffuse ahead of the oxidation front in all directions and will encroach upon the channel area 17 of the transistor; this reduces the effective width of the channel or increases the threshold voltage in an area 18 on each side. Using typical processing, this area 18 may be about 0.4 micron wide, for example. When the design rules used for a bar design provide for channel lengths of five microns, for example, and a minimum channel width of also five microns, then this encroachment by the P+ channel stop is not of great concern. However, when the channel width dimension W is nominally two microns or less, then the encroachment begins to be a very significant part of the channel width, and the higher threshold area 18 has considerable influence.

One of the methods employed to reduce the amount of encroachment at the areas 18 is to reduce the boron implant dosage for the implant that produces the channel stop 16. This implant is performed prior to growing the field oxide 15. Ordinarily, as the implant dosage is reduced, the threshold voltage in the field oxide area correspondingly is reduced. When the supply voltage to the integrated circuit is +5 v, this field threshold voltage must be in the area of +15 v to provide adequate isolation. Accordingly, the implant dosage must be maintained at a sufficient level to produce a field threshold voltage of about this level.

Figure 4:
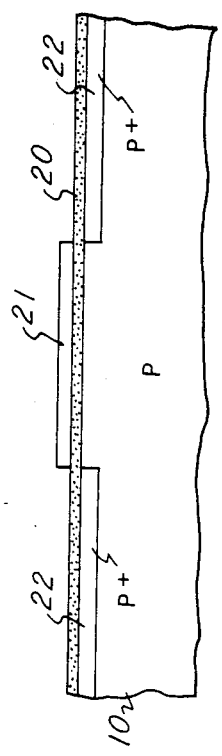
FIGS. 4 and 5 are elevation views corresponding to FIG. 3 at stages in the manufacture of the device of FIGS. 1-3.
Figure 5:
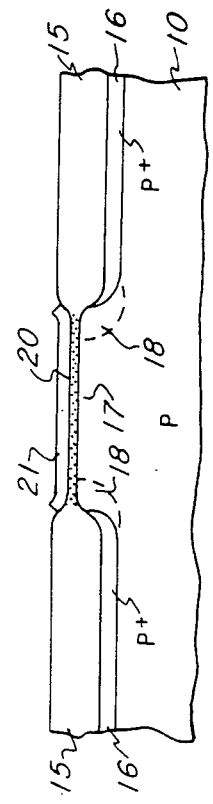

In accordance with the invention, it has been found that for a given relatively moderate level of P+ channel stop implant dosage, a higher field threshold voltage is obtained with a field oxide grown under a pressurized oxygen atmosphere. Referring to FIG. 4, a method according to the invention begins with a silicon slice (containing the bar 10) which has a thin thermal oxide layer 20 grown on it, then a nitride layer 21 is deposited and patterned. A boron implant is performed, masked by the remaining nitride 21 and photoresist (not shown), to produce P+ implanted regions 22. According to the invention, this implant is at a dosage of not exceeding $5 \times 10^{12}$ atoms/cm$^2$, in one example about $2 \times 10^{12}$ atoms/cm$^2$, in contrast to a level of $6 \times 10^{12}$ atoms/cm$^2$ or higher as would be needed if the high-pressure oxidation were not employed. Then, the slice is subjected to a temperature of about 900° C. for about 40 minutes in oxygen or steam at a pressure of about ten atmospheres (the period of time at this temperature should not be greater than about one hour); this grows the thermal oxide 15 to a thickness of about 8000 Å. The implanted boron 22 diffuses ahead of the oxidation front to create the channel stop 16. Thereafter, the process continues in the manner set forth in U.S. Pat. Nos. 4,055,444 or 4,388,121 to produce the device of FIGS. 1-3.

Since the boron implant dosage for the channel stop 16 is smaller, the boron concentration in the areas 18 is less. Yet, the field transistor threshold is about +14 or +15 v., whereas for identical processing except using atmospheric oxidation the threshold would have been about +9 v.

Some degree of improvement probably could be provided at pressures as low as about five atmospheres, but preferably the pressure is at least about nine. It may be useful up to about fifteen, but the time would be so short that control would be more difficult.

High pressure oxidation has been used in the past in silicon processing, but usually for the purpose of allowing low temperature operation.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of forming a channel stop region in making an MOS transistor at a face of a silicon body, comprising the steps of:

applying a layer of oxidation mask to said face, and patterning said layer to define a transistor channel area, subjecting said face to an impurity implant at a dosage not exceeding about $5 \times 10^{12}$ atoms/cm$^2$ to provide a channel-stop region, and subjecting said face to a high temperature in an oxidizing atmosphere at a pressure at least about five times and not more than about fifteen times atmospheric to oxidize the surface of the face to produce a thermally-grown field oxide layer with a channel-stop region beneath it in the face, in the area of said face not covered by said oxidation mask, resulting in a field threshold voltage at least about +15 v.

2. A method according to claim 1 wherein said high temperature is at least about 900° C. and said oxidation is at a pressure of at least about five atmospheres.

3. A method according to claim 2 wherein said impurity is boron, and said dosage is not over about $2 \times 10^{12}$ atoms/cm$^2$.

4. A method according to claim 3 wherein said oxidation mask is nitride, and said field oxide is many times thicker than said nitride.

5. A method of forming an isolation area at a face of a silicon body, comprising the steps of:

subjecting said area of said face to an impurity implant at a dosage not exceeding about $5 \times 10^{12}$ atom/cm$^2$ to provide a channel-stop region, and subjecting said silicon body to a high temperature of at least about 900 C. in an oxidizing atmosphere at a pressure of at least about 5 and no more than about 15 times atmospheric to oxidize said area of the face to produce a thermally-grown field oxide layer with a channel-stop region beneath it in the face, resulting in a field threshold voltage along said area of the face of at least about +15 v.

6. A method according to claim 5 wherein silicon body is P-type, said impurity is boron, and said dosage is not over about $2 \times 10^{12}$ atoms/cm$^2$.

7. A method according to claim 6 wherein said oxidation is at a pressure of at least about nine atmospheres.

8. A method according to claim 7 wherein said silicon body is subjected to said high temperature for a period of time not greater than about one hour.

* * * * *